United States Patent
Carroll (10) Patent No.: US 6,282,292 B1
(45) Date of Patent: Aug. 28, 2001

(54) AMPLITUDE INSENSITIVE SYNCHRONIZATION OF NONLINEAR SYSTEMS

(75) Inventor: Thomas L. Carroll, Alexandria, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 08/736,551

(22) Filed: Oct. 24, 1996

(51) Int. Cl.[7] ............................... H03B 29/00; G06F 1/02
(52) U.S. Cl. .................. 380/48; 380/9; 380/46; 331/78; 364/717.01
(58) Field of Search ................... 380/9, 46, 48, 380/49, 50; 331/78; 364/717.01, 717.02, 717.03, 717.04, 717.05, 717.06, 717.07

(56) References Cited

U.S. PATENT DOCUMENTS

| | | | |
|---|---|---|---|
| 5,245,660 | * 9/1993 | Pecora et al. | 380/48 |
| 5,379,346 | * 1/1995 | Pecora et al. | 380/48 |
| 5,473,694 | * 12/1995 | Carroll et al. | 380/48 |

* cited by examiner

Primary Examiner—Bernarr E. Gregory
(74) Attorney, Agent, or Firm—Thomas McDonnell; Chester Jordan (57) ABSTRACT

An amplitude insensitive synchronized nonlinear system (AISN) that allows communication between nonlinear systems operating in the chaotic realm which is insensitive to attenuation or signal noise affecting the amplitude of the drive signal, thereby allowing communication between remote systems where the amplitude of the transmitted signal has been varied by an unknown amount.

11 Claims, 11 Drawing Sheets

AMPLITUDE INSENSITIVE SYNCHRONIZATION OF NONLINEAR SYSTEMS

BACKGROUND OF THE INVENTION

The present invention relates generally to the synchronization of nonlinear systems and more particularly to a system which allows the synchronization of one nonlinear dynamical or chaotic system to another nonlinear dynamical or chaotic system insensitive to attenuation in the driving signal.

A synchronized nonlinear system can be used as an information transfer system. The transmitter, responsive to an information signal, produces a drive signal for transmission to the receiver. An error detector compares the drive signal and the output signal produced by the receiver to produce an error signal indicative of the information contained in the information signal.

It is known to those skilled in the art that a nonlinear dynamical system can be driven (the response) with a signal from another nonlinear dynamical system (the drive). With such a configuration the response system actually consist of duplicates of subsystems of the drive system, which are cascaded and the drive signal, or signals, come from parts of the drive system that are included in the response system.

A system with extreme sensitivity to initial conditions is considered chaotic. The same chaotic system started at infinitesimally different initial conditions may reach significantly different states after a period of time. Lyapanov exponents (also known in the art as "characteristic exponents") measure this divergence. A system will have a complete set of Lyapunov exponents, each of which is the average rate of convergence (if negative) or divergence (if positive) of nearby orbits in phase space as expressed in terms of appropriate variables and components.

Sub or Conditional Lyapunov exponents are characteristic exponents which depend on the signal driving the system. It is also known to those skilled in the art that, if the sub-Lyapunov, or conditional Lyapunov, exponents for the driven response system are all negative, then all signals in the response system will converge over time or synchronize with the corresponding signals in the drive. When the response system is driven with the proper signal from the drive system, the output of the response system is identical to the input signal. When driven with any other signal, the output from the response is different from the input signal.

In brief, a dynamical system can be described by the ordinary differential equation $$\dot{\alpha}(t) = f(\alpha) \quad (1)$$

The system is then divided into two subsystems. $\alpha = (\beta, \chi)$;

$$\dot{\beta} = g(\beta, \chi)$$

$$\dot{\chi} = h(\beta, \chi) \quad (2)$$

where $\beta = (\alpha_1 \ldots \alpha_n)$, $g = (f_1(\alpha) \ldots f_n(\alpha))$, $h = (f_{n+1}(\alpha) \ldots f_m(\alpha))$, $\chi = (\alpha_{n+1}, \ldots \alpha_m)$, where $\alpha$, $\beta$ and $\chi$ are measurable parameters of a system, for example vectors representing an electromagnetic wave.

The division is arbitrary since the reordering of the $\alpha_i$ variables before assigning them to $\beta$, $\chi$ g and h is allowed. A first response system is created by duplicating a new subsystem $\chi'$ identical to the $\chi$ system, and substituting the set of variables $\beta$ for the corresponding $\beta'$ in the function h, and augmenting Eqs. (2) with this new system, giving $$\dot{\beta} = g(\beta, \chi)$$

$$\dot{\chi} = h(\beta, \chi)$$

$$\dot{\chi}' = h(\beta, \chi') \quad (3)$$

If all the sub-Lyapunov exponents of the $\chi'$ system (ie. as it is driven) are less than zero, then $[\chi' - \chi] \to 0$ as $t \to$ infinity. The variable $\beta$ is known as the driving signal. One may also reproduce the $\beta$ subsystem and drive it with the $\chi'$ variable, giving $$\dot{\beta} = g(\beta, \chi)$$

$$\dot{\chi} = h(\beta, \chi)$$

$$\dot{\chi}' = h(\beta, \chi')$$

$$\dot{\beta}'' = g(\beta'', \chi') \quad (4)$$

The functions h and g may contain some of the same variables. If all the sub-Lypaunov exponents of the $\chi'$, $\beta''$ subsystem (ie. as it is driven) are less than 0, then $\beta'' \to \beta$ as $t \to$ infinity. The example of the Equ. (4) is referred to as cascaded synchronization. Synchronization is confirmed by comparing the driving signal $\beta$ with the signal $\beta''$.

Generally, since the response system is nonlinear, it will only synchronize to a drive signal with the proper amplitude. If the response system is as some remote location with respect to the drive system, the drive signal will probably be subjected to some unknown attenuation. This attenuation can be problematic to system synchronization.

The present invention is a system design featuring subsystems which are nonlinear and possibly chaotic, but will still synchronize when the drive signal is attenuated or amplified by an unknown amount. This invention builds on the design of two previous inventions, the synchronizing of chaotic systems, U.S. Pat. No. 5,245,660, and the cascading of synchronized chaotic systems, U.S. Pat. No. 5,379,346, both herein incorporated by reference. The present invention extends those principles to situations where the drive signal has been attenuated by some unknown amount. Applicants overcome this limitation by providing for a nonlinear response system that is not amplitude dependent and a separate function that is part of the drive system only that is amplitude dependent.

SUMMARY OF THE INVENTION

Accordingly, it is an object of the present invention to provide a chaotic system which will reproduce a signal that is a scaled version of one or more drive signals even when the drive signal, or signals, are subject to attenuation, fading, and desynchronize this response signal by varying a parameter in the drive or response system.

It is also an object of the present invention to provide a chaotic system which will detect the variation of a parameter or parameters in the drive or response systems by detecting desynchronization.

A further object of the present invention is to provide a system which will send information on a chaotic carrier in a way that is not sensitive to noise or fading by comparing the input and output of the response system while varying the drive system. These and additional objects of this invention are accomplished by the structures and processes hereinafter described.

The present invention is an amplitude insensitive synchronized nonlinear system (AISN) which allows communication between nonlinear systems operating in the chaotic realm which is largely insensitive to attenuation or signal noise affecting the amplitude of the drive signal, thereby allowing communication between remote systems where the amplitude of the transmitted signal has been varied by an unknown amount.

AISN comprises a transmitter system (drive) employing linear or scale invariant nonlinear subsystems, the output of the one driving the other, at least two which are amplitude insensitive in operation. The signal produced by the second scale invariant nonlinear subsystem is then used to drive an amplitude dependent nonlinear function. The amplitude dependent nonlinear function acts to bound the chaotic signal and prevent the signals from diverging uncontrollably, and is designed to have characteristics that ensure a plot of its input vs. output can be related at the same reference point. This is critical because this common reference point serves as a baseline point for one to determine system synchronization. The chaotic transmitter signal produced by the amplitude dependent function is then transmitted to a nonlinear cascaded receiver.

AISN employs a receiver (response) which comprises subsystems which are duplicates of the transmitters scale invariant subsystems and are arranged to be responsive to the AISN transmitter. Synchronization is confirmed by sampling the value of the transmitted signal. If the input to the receiver and the output pass through known reference points at the same time, then the transmitter and receiver are known to be synchronized. Information may be encoded by making the output from the receiver go out of synchronization with the input by altering the transmitted signal.

The synchronized nonlinear system can be used as an information transfer system. The transmitter, responsive to an information signal, produces a drive signal for transmission to the receiver. An error detector compares the drive signal and the output signal produced by the receiver to produce an error signal indicative of the information contained in the information signal.

DETAILED DESCRIPTION

Figure 1:
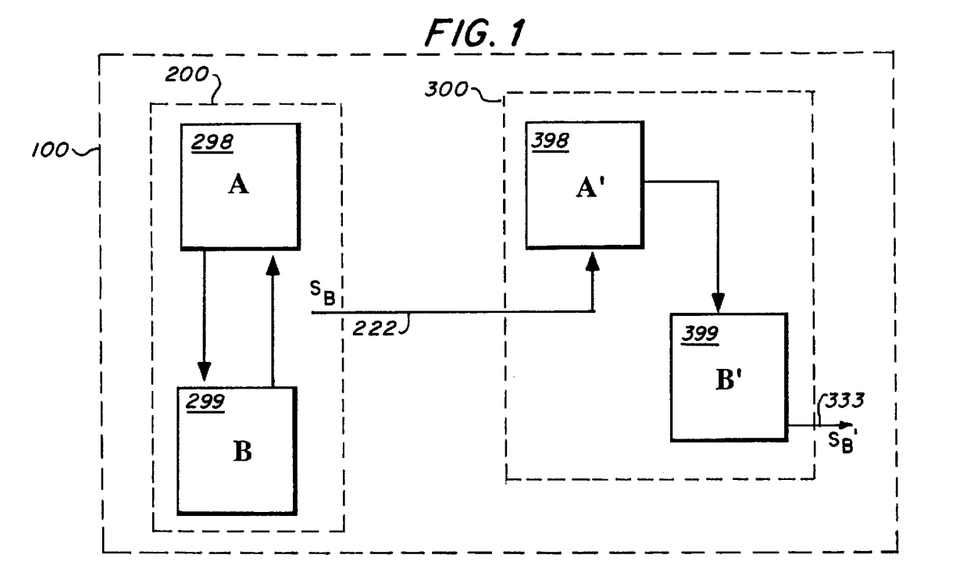
FIG. 1 is a block diagram of a cascaded synchronized nonlinear system (prior art).

Referring now to the figures, wherein like reference characters indicate like elements throughout the several views, FIG. 1 illustrates a block diagram of the basic architecture of a cascaded synchronizing nonlinear system 100 divided into subsystems A 298, B 299, A' 390 and B' 399, for producing synchronized communication signals $S_B$ 222 and $S_B'$ 333. The system is a tangible system that can be of any form. Examples of signals, such as signals $S_B$ 222 and $S_B'$ 333 can be associated with system 100 can be electrical, optical or other electromagnetic signals, pressure, force temperature, chemical concentration, population or others.

Since the response system 300 is nonlinear, it will only synchronize to a drive signal 222 from the drive system 200 having the proper amplitude. In other words, for some nonlinear function f(x), rescaling x produces a different result: $f(\Gamma x) \neq \Gamma f(x)$. There are nonlinear functions for which the equality does not hold; for example, if f(x) is polynomial nonlinear, exponentially nonlinear or piecewise linear the desired characteristics are present. For example, if f(x) is piecewise nonlinear, (f(x) may be constructed from the line segments with different slopes) and f(x) has its only break point at the origin, then $f(\Gamma x)=\Gamma f(X)$, so that f(x) is scale invariant. Any amplitude dependent nonlinear function in which the input and output can be related at some point will is acceptable. If one has functions f(x, y, z), h(x, y, z), and u(x, y, z) which contain only scale invariant nonlinearities, it is possible to construct a scale-invariant set of differential equations:

$$\frac{d(\Gamma x)}{dt} = \Gamma \frac{dx}{dt} = f(\Gamma x, \Gamma y, \Gamma z) \Gamma f(x, y, z) \tag{5}$$

$$\frac{d(\Gamma y)}{dt} = \Gamma \frac{dy}{dt} = h(\Gamma x, \Gamma y, \Gamma z) = \Gamma h(x, y, z)$$

$$\frac{d(\Gamma z)}{dt} = \Gamma \frac{dz}{dt} = u(\Gamma x, \Gamma y, \Gamma z) = \Gamma u(x, y, z)$$

Figure 2:
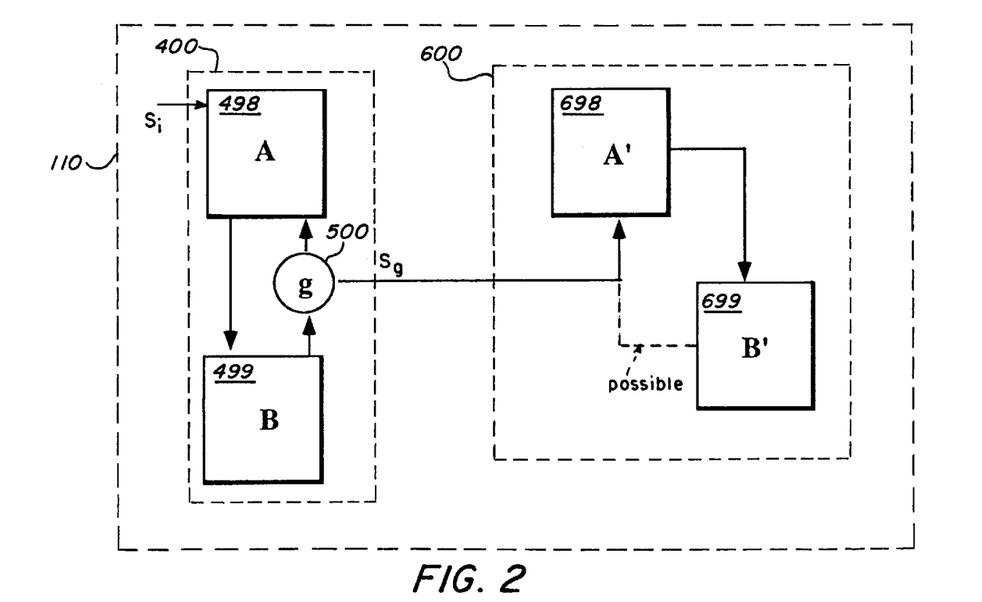
FIG. 2 is a block diagram of an amplitude insensitive synchronized nonlinear system.

The scale factor $\Gamma$ will cancel, so that rescaling all of the variables does not affect the dynamics of the system. This relation is also true for a linear set of equations. It is not possible to get chaos out of a scale invariant set of equations such as equation (5). Some instability is necessary for chaos to exist, so that nearby phase space trajectories diverge from each other. The trajectories will diverge to infinity, however, unless some mechanism exists to fold them back when some variable becomes too large. This requires that some part of the differential equations for a chaotic system depend on the amplitude of at least one of the variables. It is useful to isolate the amplitude dependence in one function, g(x) for example. When the chaotic system is constructed properly, then g(x) may also be used as a driving signal to drive a cascaded response system. FIG. 2 is a block diagram of such a system. Referring now to FIG. 2, the signal from B to A in the full chaotic system passes through the amplitude-dependent function g. The signal $S_{g(x)}$ may then be used to drive A' in the response system, which then drives B'. Rather than comparing $S_B'$ to $S_B$ to confirm synchronization, as is FIG. 1, synchronization is confirmed by comparing $S_B'$ with g(x). In order to make the detection of synchronization easier, it is useful to make $g(x_0)=\alpha_0$, where $\alpha_0$ is a known reference point for some $x_0$ so that the input and output of the response system may be directly compared.

If A and B are linear or contain only scale-invariant nonlinearities, then if the driving signal $S_{g(x)}$ is replaced by $\Gamma S_{g(x)}$, the signals in B' and A' will be scaled by $\Gamma$ relative to the signals in A and B. The use of a function of a variable rather than the variable itself as a driving signal to synchronize the chaotic systems has been described before (L. Kocarev and U. Parlitz, *General Approach for Chaotic Synchronization with Applications to Communication,* Phys. Rev. Lett. 74, p. 5028, (June 1995)), but in the Kocarev and Parlitz approach the entire chaotic drive system must be reproduced and the other subsystems contain non scale-invariant nonlinearities. In the present invention, the driving function need not be reproduced.

It should be noted that with the right choice of g, it is possible for A and B to be linear. It is advantageous for communications to have A or B include some nonlinearity, as this makes it harder to decode an encoded information signal and easier to separate noise from the chaotic signal.

Figure 3:
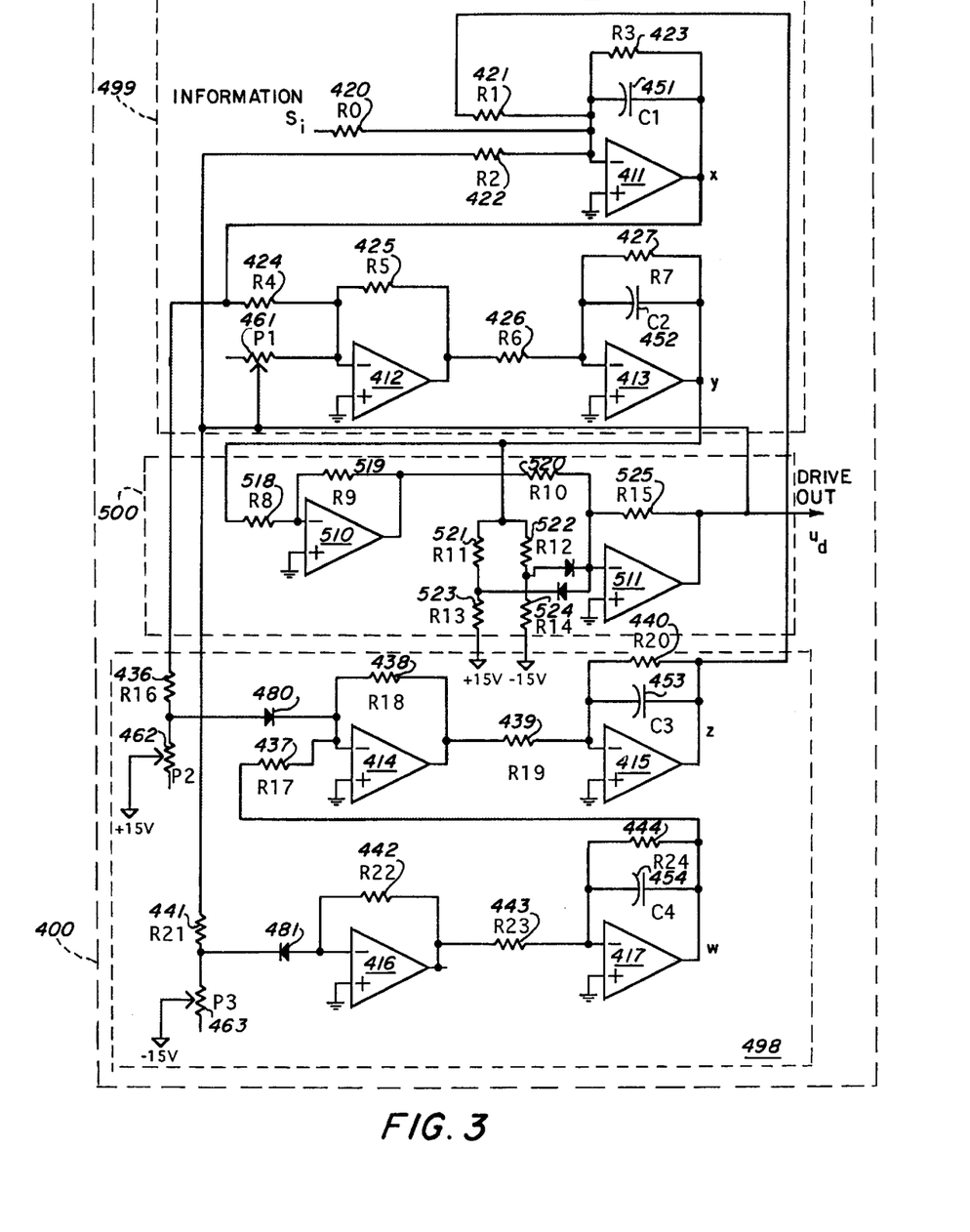
FIG. 3 is a schematic diagram of an example chaotic drive circuit constructed in accordance with this invention.

As a specific example, FIG. 3 shows a schematic diagram for a chaotic drive circuit fulfilling the above conditions.

Drive circuit 400 comprises two interdependent subsystems A 498 and B 499 which may or may not overlap in part but which together constitute the essential aspects of the amplitude independent system of the drive. Subsystems A 498 and B 499 are not overlapping in the sense that neither subsystem A 498 nor subsystem B 499 is contained within the other system. Drive circuit 400 also comprises an amplitude dependent function g(x), 500.

Drive circuit 400 comprises integrator circuits formed by differential amplifiers 411, 413, 415, 417, resistors 420, 421, 422, 423, 426, 427, 439, 440, 443, 444, and capacitors 451, 452, 453, and 454, amplitude independent nonlinear functions formed by differential amplifiers 414, 416 resistors 437, 438, 442 and diodes 480 and 481 and a summing circuit formed by differential amplifier 412 and resistors 424 and 425. These circuits are coupled to form subsystems A 498 and B 499 in the drive circuit as illustrated in FIGS. 2 and 3. Drive circuit 400, also comprises g(x), the nonlinear amplitude dependent nonlinear function 500 (piecewise in this example), formed by differential amplifiers 510, 511, resistors 518, 519, 520, 521, 522, 523, 524, 525 and diodes 580 and 581. Component values for the resistors and capacitors which were used are set fourth in the following table:

| | |
|---|---|
| R420 = 1MΩ | R421 = 68k |
| R422 = 2M | R423 = 1M |
| R424 = 20k | R425 = 10k |
| R426 = 100k | R427 = 680k |
| R438 = 5k | R439 = 100k |
| R440 = 100k | R441 = 2.2k |
| R442 = 10k | R443 = 10k |
| R444 = 10k | R518 = 20k |
| R519 = 10k | R520 = 10k |
| R521 = 10k | R522 = 10k |
| R523 = 150k | R524 = 150k |
| R525 = 33k | |
| C451 = 0.001 μF | C452 = 0.001μ |
| C453 = 0.001μ | C454 = 0.001μ |

-continued

| |
|---|
| P461 = 30k set to 22.5k |
| P462 = 200k break/ g2 @ 0.0 V |
| P463 = 200k break/ g3 @ 0.0 V |

Resistance values are expressed in Ohms and capacitance values are expressed in Farads.

Drive circuit 400 can be subdivided into three subsystems A 498, B 499 and g(x) 500. Although the illustrative subsystems g(x) 500, A 498 and B 499 shown in FIG. 2 correspond to the two circuits forming drive circuit 400 its is not necessary, and the division of a given drive circuit 400 into subsystems in order to determine the proper configuration for a synchronized response circuit 600 is made in accordance with the analysis described herein.

The nonlinear folding function is $g_1(y)$, while the amplitude(scale)-invariant nonlinearities are provided by functions $g_2(x)$ and $g_3(y)$. The equations describing the circuit are:

$$\frac{dx}{dt} = -\alpha(0.05x + 0.05g_1(y) + 1.47z + 0.1s_1) \quad (6)$$

$$\frac{dy}{dt} = -\alpha(-0.5x - 0.44g_1(y) + 0.147y)$$

$$\frac{dz}{dt} = -\alpha(-0.5g_2(x) + z - 0.5w)$$

$$\frac{dw}{dt} = -\alpha(-10.0g_3(g_1(y)) + 10.0w)$$

$$g_1(y): \begin{bmatrix} y \leq -1.6 & g_1 = -2.5y - 7.2 \\ -1.6 < y < 1.6 & g_1 = 2.0y \\ 1.6 \leq y & g_1 = -2.5y + 7.2 \end{bmatrix}$$

$$g_3(y): \begin{bmatrix} y \leq 0 & g_3 = 4.5y \\ y > 0 & g_3 = 0 \end{bmatrix}$$

$$g_2(x): \begin{bmatrix} x \leq 0 & g_2 = 0 \\ x > 0 & g_2 = 4.5x \end{bmatrix}$$

where the time factor $\alpha$ was $10^4$.

Figure 4A:
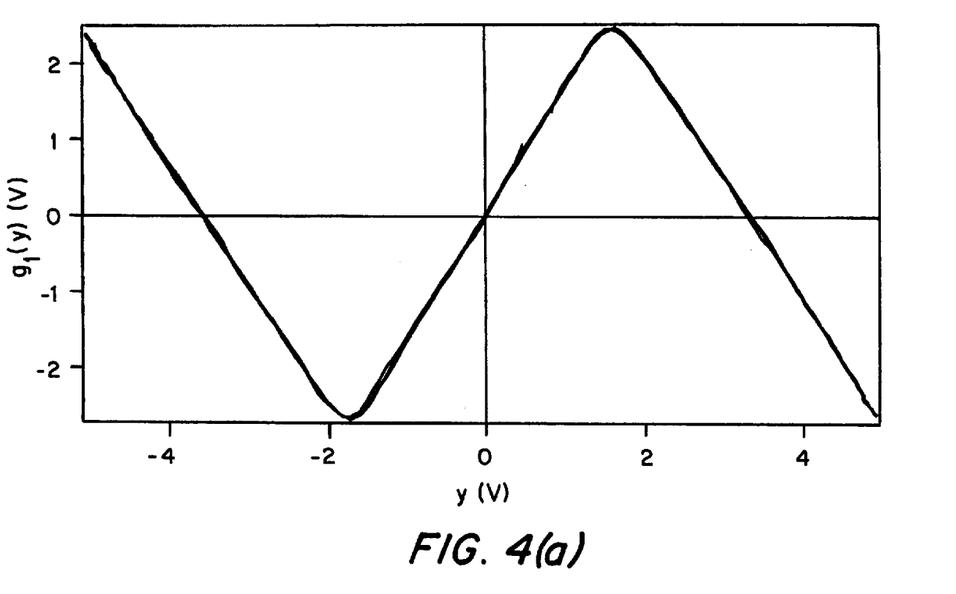
FIG. 4(a) is a graphical representation of input signal Y and the output signal from circuit function $g_1(x)$.
Figure 4B:
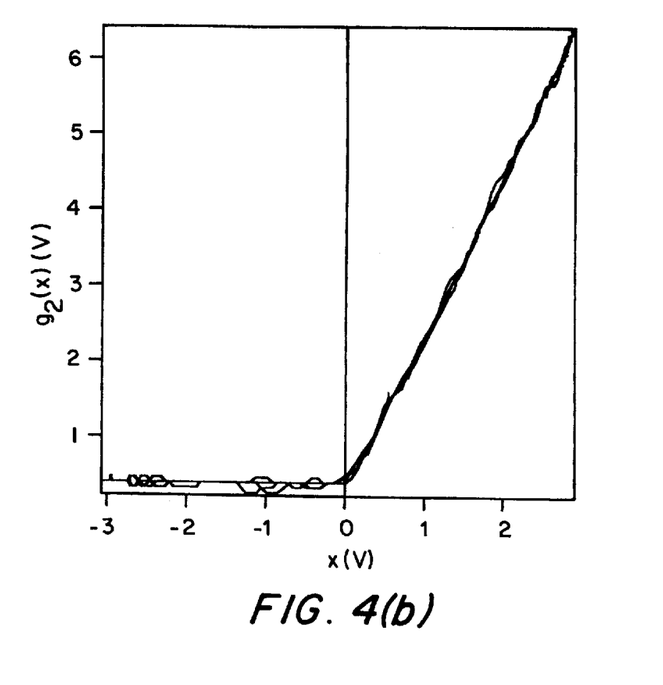
FIG. 4(b) is a graphical representation of input signal X and the output signal from circuit function $g_2(x)$.
Figure 4C:
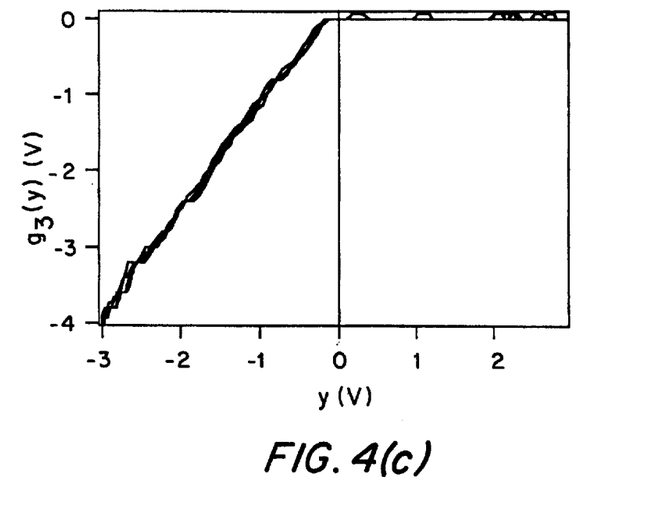
FIG. 4(c) is a graphical representation of input signal Y and the output signal from circuit function $g_3(y)$.

The plots of functions $g_1(y)$, $g_2(x)$ and $g_3(y)$ as defined in FIG. 3 and equation (6), are illustrated in FIGS. 4a, 4b, and 4c, respectively. These plots reflect the driving of the above nonlinear functions with a 10 Hz sine wave. $S_I$ is a non-zero information signal, injected into drive circuit 400 when the circuits are used for communications. The presence of chaos in drive circuit 400 is confirmed by calculating the largest Lyapunov exponent numerically from eqs. (6). This exponent is 765 $s_{-1}$. Conventional methods for calculating Lyapunov exponents, as analytical measurement, numerical and otherwise can be used, such as, for example those described by Eckmann et al., *Rev. Mod Phys.,* Vol. 57, p.617 et seq. (1985); Lichtenberg et al., *Regular and Stochastic Motion,* Springer-Verlag, New York (1983); Rashband, *Chaotic Dynamics of Nonlinear Systems,* John Wiley & Sons, New York (1990); and Wolf et al., *Physica.* Vol. 16D, p. 285 et seq. (1985).

Figure 5:
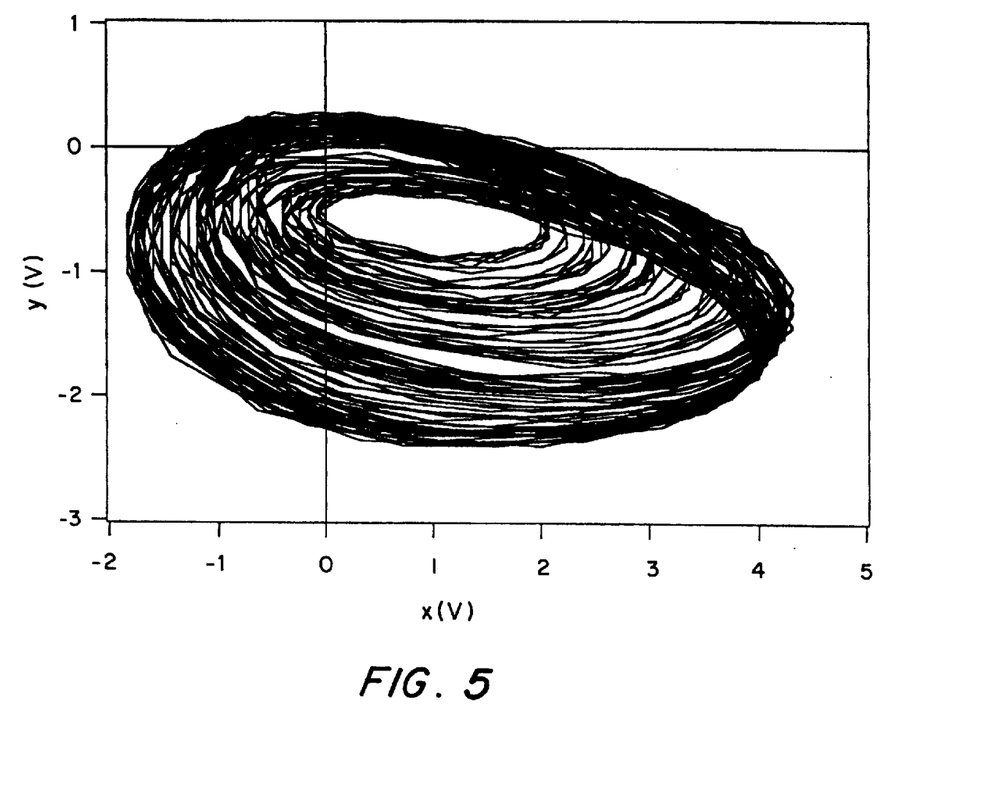
FIG. 5 is the chaotic attractor from the example drive circuit of FIG. 3.

The chaotic attractor for example drive circuit 400, produced by plotting the y signal vs. the x signal is shown in FIG. 5.

Figure 6:
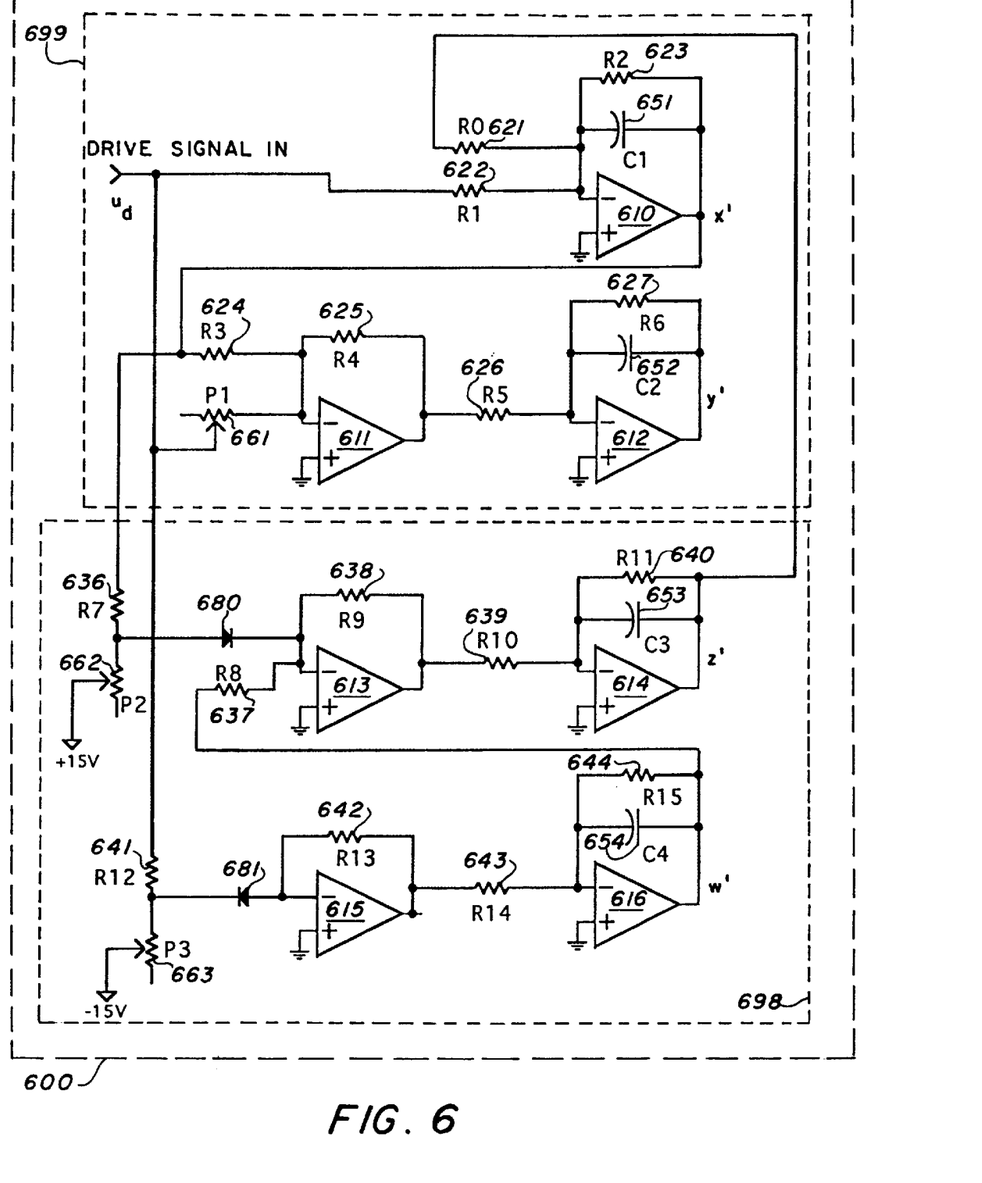
FIG. 6 is a schematic diagram of an example response circuit for FIG. 3 constructed in accordance with this invention.

Referring now to FIG. 6, which shows an example of a chaotic response circuit 600 built to synchronize with drive circuit 400 of FIG. 3, comprises duplicates of subsystems A 498 and B 499 of drive circuit 400, labeled as subsystems A' 698 and B' 699.

Response circuit 600 comprises integrator circuits formed by differential amplifiers 611, 613, 615, 617, resistors 620, 621, 622, 623, 626, 627, 639, 640, 643, 644, and capacitors 651, 652, 653, and 654, amplitude independent nonlinear functions formed by differential amplifiers 614, 616 resistors 637, 638, 642 and diodes 680 and 681 and a summing circuit formed by differential amplifier 612 and resistors 624 and 625. These circuits are coupled to form subsystems A' 698 and B' 699 in response circuit 600 as illustrated in FIGS. 2 and 6. The reader should note that g(x), the amplitude dependent nonlinear circuit 500, is not reproduced in response circuit 600. Component values for the resistors and capacitors which were used are set fourth in the following table:

| | |
|---|---|
| R621 = G8kΩ | R622 = 2M |
| R623 = 1M | R624 = 20k |
| R625 = 10k | R626 = 100k |
| R627 = 680k | R638 = 5k |
| R639 = 100k | R640 = 100k |
| R641 = 2.2k | R642 = 10k |
| R643 = 10k | R644 = 10k |
| C651 = 0.001 µF | C652 = 0.001µ |
| C653 = 0.001µ | C654 = 0.001µ |
| P661 = 30k set ta 22.5k | |
| P662 = 200k break/ g2 @ 0.0 V | |
| P663 = 200k break/ g3 @ 0.0 V | |

Response circuit 600 can be subdivided into two subsystems A' 698 and B' 699. Although the illustrative subsystems A' 698 and B' 699 shown in FIG. 2 correspond to the two circuits forming response circuit 600, its is not necessary, and the division of a given response circuit 600 into subsystems in order to determine the proper configuration for synchronization with a drive circuit 400 is made in accordance with the analysis described herein.

The equations describing the circuit are:

$$u_d = \Gamma g_1(y) \quad (7)$$

$$\frac{dx'}{dt} = -\alpha(0.05x' + 0.05u + 1.47z')$$

$$\frac{dy'}{dt} = -\alpha(-0.5x' - 0.44u + 1.47y')$$

$$\frac{dz'}{dt} = -\alpha(-0.5g_2(x') + z - 0.5w')$$

$$\frac{dw'}{dt} = -\alpha(-10.0g_3(u) + 10.0w')$$

The output function $g_1(y)$ has been rescaled by a factor $\Gamma$ to produce the driving variable $u_d$. The largest Lyapunov for the response circuit is calculated numerically to be $-1470.0 s^{-1}$, independent of the scaling factor $\Gamma$.

Figure 10:
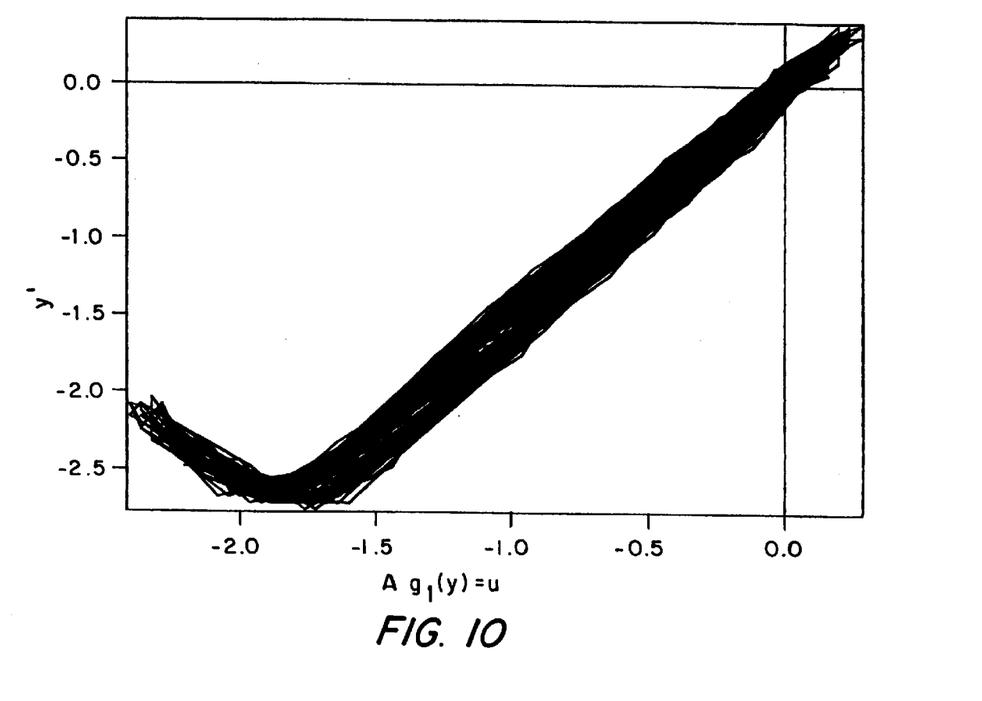
FIG. 10 is a plot of the drive signal $u_d$ vs. the output signal Y' from the response circuit.

It is necessary for $u_d = \Gamma g_1(y)$ to have a known relation to y' at some known value of y in order to detect synchronization of the drive 400 and response 600 circuits. This relationship must be independent of the scaling factor $\Gamma$. In the example circuit above this relation is satisfied by $\Gamma g_1(0)=0$. Referring now to FIG. 10, which is a graph of y' vs the transmitted signal $u_d$ when the scaling factor is $\Gamma=1$, the reader should note that for all values of $\Gamma$, the graph passes through the origin (0,0). This allows synchronization to be confirmed by sampling the value of the transmitted signal $u_d$ when y' crosses 0. When the circuits are in synchronization, the sampled value is 0.

Among the many embodiments of the present invention, AISN may be employed to transmit information on a chaotic carrier in the form of data encoded on a pure frequency signal. The system allows the transmission of the data by a means which is insensitive to fading distortion and not very sensitive to other types of noise. Referring to FIGS. 2, 3, 6, and 13 example chaotic drive circuit 400, forms a portion of a transmitter 800 and example chaotic response circuit 600 forms part of a receiver 900. Drive circuit 400 is injected with an information signal $S_I$. Assume, for purposes of example, the signal $S_I$ is configured as 2.0 sin($2\pi f_I t$) where $f_I$ is less than 200 Hz. The frequencies which contain much of the power for the transmitted signal approach 2 kHz, so the $S_I$ frequency is small in comparison to maximize the S/N ratio in receiver 900. Frequencies above 200 Hz for $S_I$ would tend to lower the S/N ratio in this example. The effects of different types of signal encoding are system dependent; for the circuit described in FIG. 3 and equation (6), the fact that different types of signal encoding move the plot (see FIG. 10) of y' vs $u_d$ in different directions may be used for sending multiple information signals on one chaotic signal.

Referring again to FIG. 3, the information signal $S_I$ is injected into the integrator whose output voltage is labeled as X. The drive signal $u_d$ may be transmitted to response circuit 600 by any desired conventional wired or wireless fashion, 11. The information signal is decoded from the chaotic carrier $u_d$ by comparing $u_d$ to response 600 output y' as y' crosses 0. In order to detect the information in the chaotic carrier signal $u_d$, the negative-going zero crossings of the signal y' from the response circuit is used to strobe $u_d$, generating a detected signal Δ. When drive 400 and response 600 circuits are synchronized, $u_d$ is zero when y' is zero, therefore Δ is zero. When response 600 and drive 400 are not synchronized, $u_d$ is nonzero when y' crosses zero, so Δ is non-zero. Generally, for a small signal $S_I$ injected into the drive 400 system (or if any parameter is changed by a small amount), the average of Δ is proportional to the injected signal (or the parameter difference between the drive and response system). If $S_I$ has a much lower frequency than the average rate at which y' crossed zero, Δ can also be used to detect $S_I$, since the information signal $S_I$, causes a lack of synchronization. Passing Δ through a low pass filter (not shown) has the effect of averaging Δ to reveal the information signal $S_I$.

Figure 7:
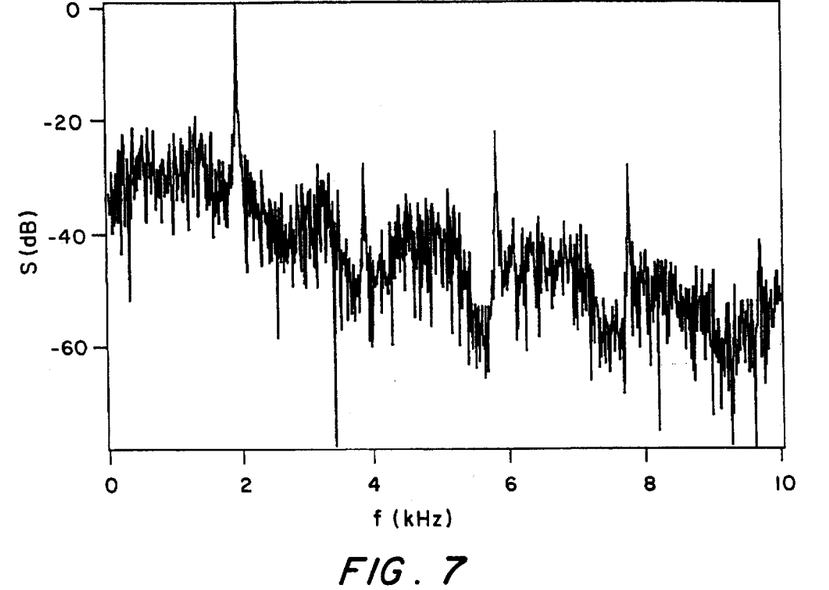
FIG. 7 is a representation of the power spectrum of the transmitted chaotic signal $u=\Gamma g_1(y)$.
Figure 8A:
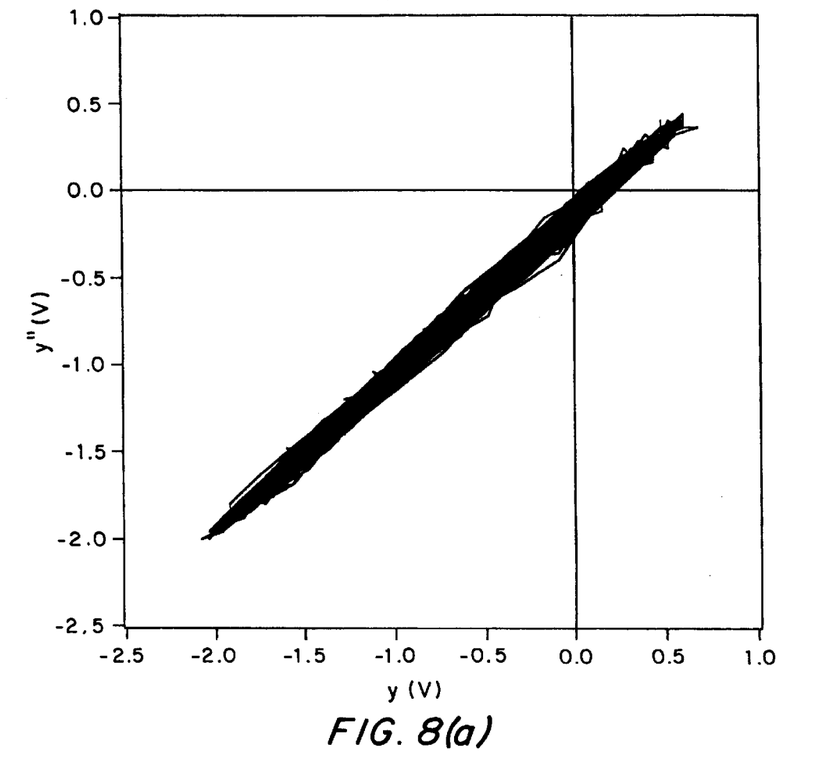
FIG. 8(a) is a plot of the Y signal form the driving circuit vs. the Y' signal from the receiving circuit with a scaling factor of $\Gamma=1.0$.
Figure 8B:
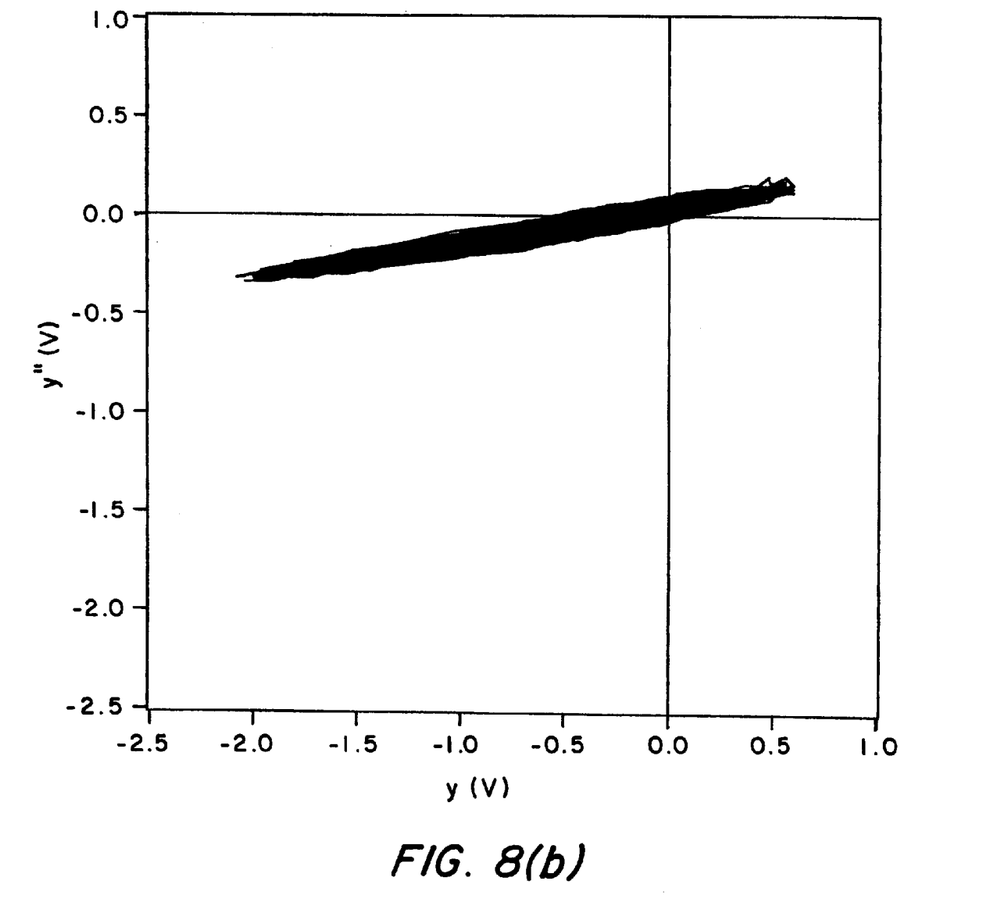
FIG. 8(b) is a plot of the Y signal form the driving circuit vs. the Y' signal from the receiving circuit with a scaling factor of $\Gamma=0.2$.
Figure 9:
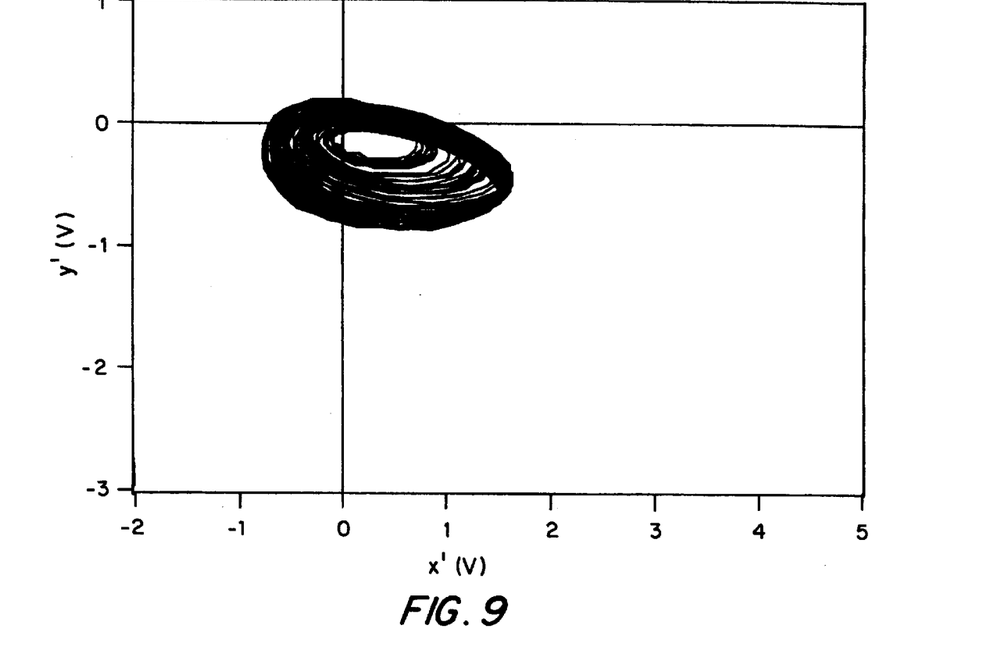
FIG. 9 is the chaotic attractor for the response circuit with a scaling factor of $\Gamma=0.5$.
Figure 11:
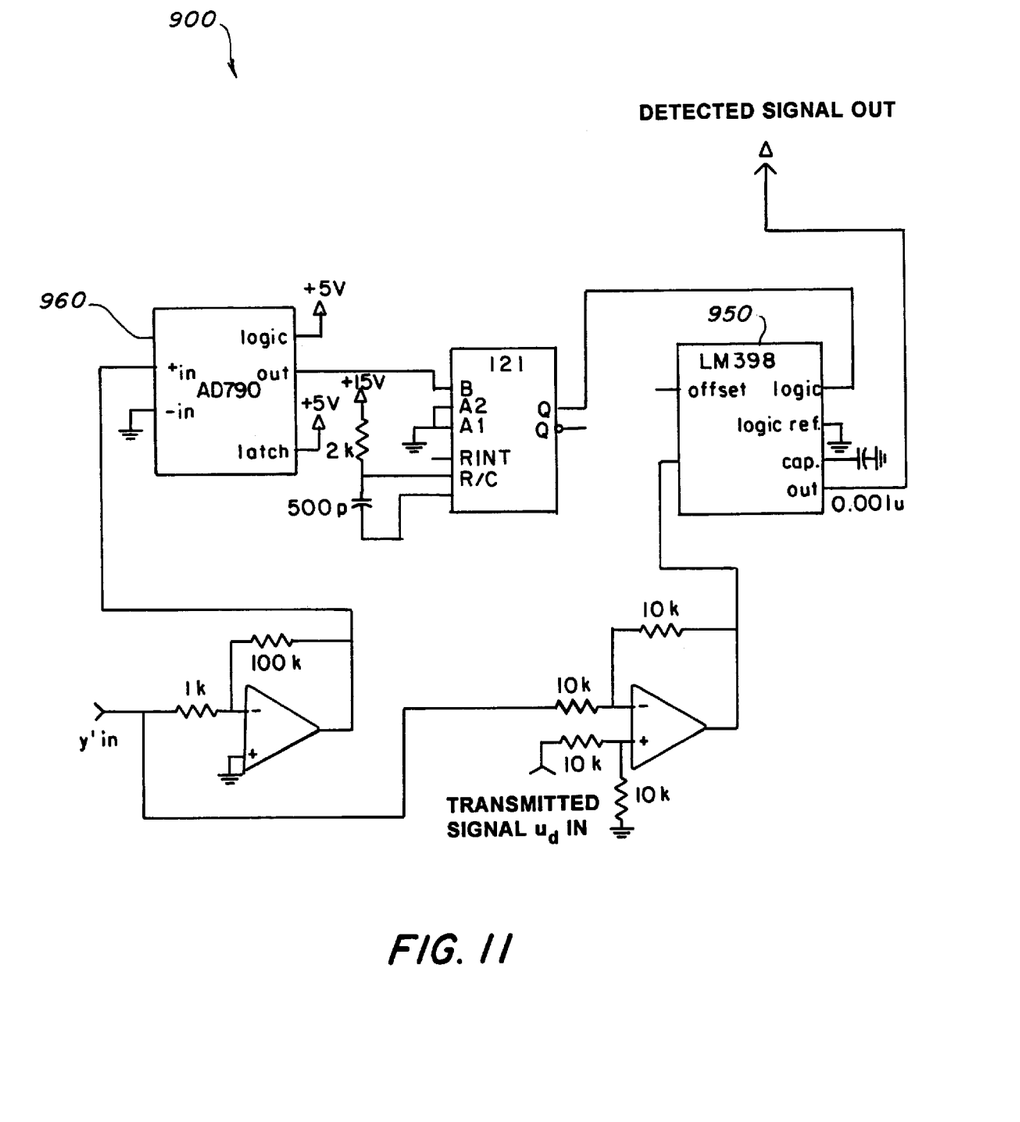
FIG. 11 is a schematic diagram of an example of the synchronization detection circuit.
Figure 12:
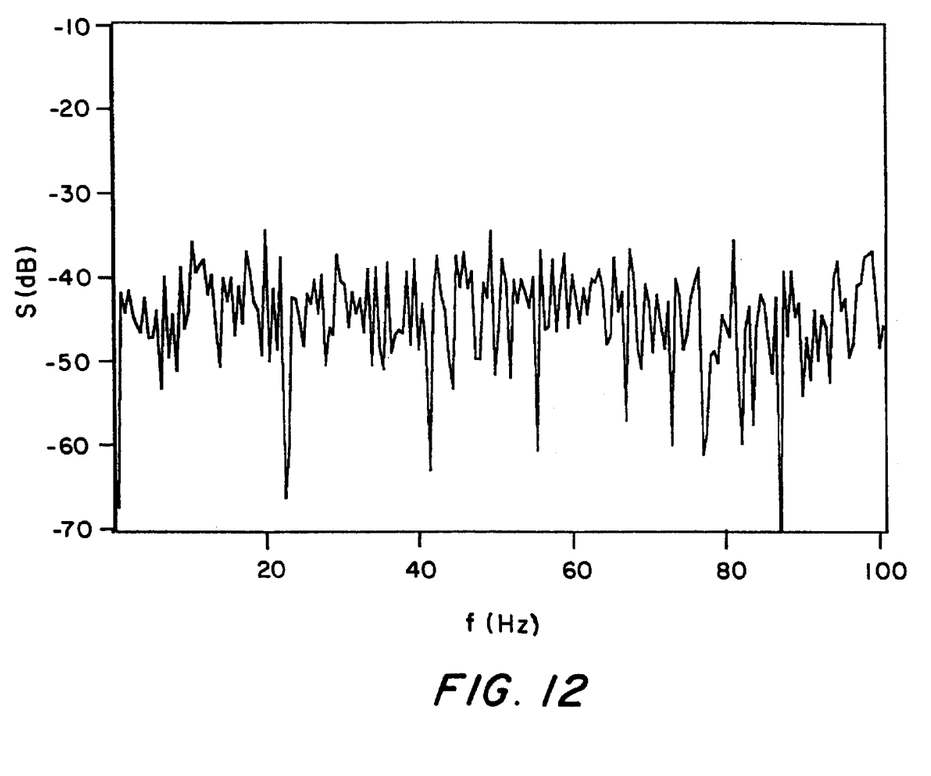
FIG. 12 is a plot of the low frequency power spectrum of $u_d$.
Figure 13:
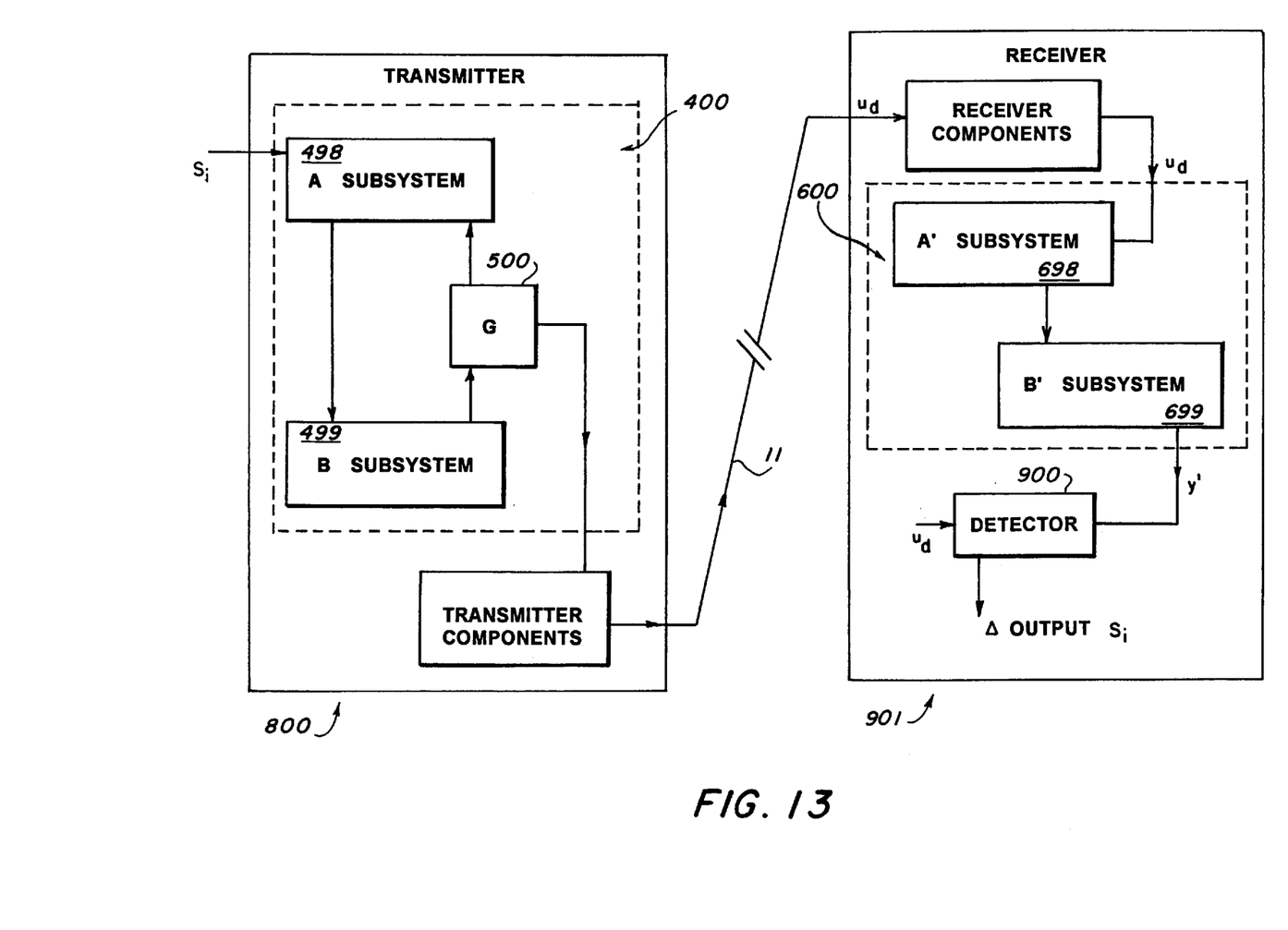
FIG. 13 is a block diagram of an signal transmission system featuring amplitude insensitive chaotic synchronization.

Detector circuit 900, shown in FIG. 11, may be used to decode the information signal. The signal y' is greatly amplified and applied to a comparator 960 so that a pulse is generated when y' crosses 0 in the negative direction. This pulse is applied to a sample and hold amplifier 950 which samples the difference between y' and $u_d$ when y' crosses 0. The output of the sample and hold amplifier 900 is the detected signal. FIG. 12 shows the low frequency power spectrum of the transmitted signal $u_d$ when the informational signal $f_I$ is 30 Hz. The signal to noise ratio at $f_I$ was calculated by subtracting the average signal power (in dB) within 2 Hz of $f_I$ (not including the power at $f_I$) from the power at $f_I$. FIG. 7 displays a plot of the power spectrum of the transmitted signal $u_d$, which shows the broad band nature of chaos. FIG. 8(a) shows a plot of the y' signal vs. y when $\Gamma=1$, showing synchronization. In FIG. 8(b) also shows a plot of the y' signal vs. y however in 8(b) $\Gamma=0.2$. The signal y' is now a scaled version of y. FIG. 9 shows y' vs. x' in the response circuit when $\Gamma=0.5$. The plot of FIG. 9 is a scaled reproduction of the attractor in FIG. 5.

Many other possible choices for the drive circuit 400 and the corresponding response circuit 600 are possible and may require transformation of the circuit equations to model them. This can be determined as described hereinabove for nonlinear circuits by analyzing the circuit dynamics in terms of the sub-Lyapunov exponents to determine which signal(s) to choose as a drive signal or signals, and which subcircuit is to be used as a model for the response circuit 600.

The foregoing descriptions of the preferred embodiments are intended to be illustrative and not limiting. The present invention is applicable to any system which requires amplitude insensitive synchronization of remote signals and/or their low correlation with each other. For example the present invention is suited for use in control devices relying on wide-frequency-band synchronized signals. Obviously, numerous modifications and variations of the present invention are possible in light of the above teachings without departing from the spirit of scope of the present invention.

We claim:

1. A synchronized nonlinear communication system comprising:

a transmitter system for transmitting a nonlinear signal, said transmitter system comprising a drive system said drive system having at least two nonlinear subsystems, the output of a first nonlinear subsystem driving a second nonlinear subsystem, said second subsystem driving an amplitude dependent function which produces an output signal, said amplitude dependant functions input and output having a known relationship at some point, said output signal driving said first nonlinear subsystem, said output signal being transmitted by said transmitter;

a receiver system for receiving said output signal, comprising a response subsystem, said response subsystem having at least two nonlinear subsystems said nonlinear subsystems being duplicates of said nonlinear subsystems contained in said transmitter system, said response subsystem adapted to be responsive to said output signal produced by said transmitter system;

a means for coupling said transmitter and receiver subsystems; wherein said transmitter system transmits said signal to said receiving system and said receiving system synchronizes with said transmitter system.

2. The system of claim 1 wherein at least one of said nonlinear subsystems is amplitude invariant.

3. The system of claim 2 wherein said nonlinear subsystems and said amplitude dependent function form a chaotic drive system.

4. The system of claim 3 wherein said nonlinear subsystems of the receiver form a chaotic response system.

5. The system of claim 1 having a detector circuit coupled to said response system adapted to detect synchronization of said drive subsystem and said response subsystem.

6. A synchronized nonlinear communication system comprising:

a transmitter system for transmitting a nonlinear signal, said transmitter system having a drive system, said drive system comprising an amplitude dependent function which produces an output signal, said amplitude dependent functions input and output having a known relationship at some point, said output signal being transmitted by said transmitter;

a receiver system for receiving said output signal transmitted by said transmitter, comprising a response subsystem, said response subsystem adapted to be responsive to said output signal;

a means for coupling said transmitter and receiver subsystems;

wherein said transmitter system transmits said signal to said receiving system and said receiving system synchronizes with said transmitter system.

7. The system of claim 6 wherein said drive system further comprises at least one amplitude independent nonlinear subsystem driving said amplitude dependent function.

8. The system of claim 7 wherein said nonlinear subsystems and nonlinear amplitude dependent function of said drive system operate in the chaotic realm.

9. The system of claim 8 wherein said response subsystem comprises at least one amplitude independent nonlinear subsystem, said amplitude independent nonlinear subsystem being a duplicate of said at least one amplitude independent nonlinear subsystem contained in said drive subsystem.

10. The system of claim 9 having a detector circuit coupled to said response system adapted to detect synchronization of said drive subsystem and said response subsystem.

11. A synchronized nonlinear communication system comprising:

(a) a nonlinear transmitter having first, second and third subparts, said first subpart driving said second subpart, said second subpart driving a third subpart having an amplitude dependent nonlinear function, said third subpart producing a chaotic transmitter signal, said chaotic transmitter signal driving said first subpart, said nonlinear transmitter being for transmitting said chaotic transmitter signal; and (b) a nonlinear receiver responsive to said chaotic transmitter signal transmitted by said transmitter, said receiver being for producing an output signal in synchronization with said chaotic transmitter signal, said receiver comprising a first stage responsive to said chaotic transmitter signal for producing a first receiver signal, the first stage being a duplicate of said first subpart, and said receiver further comprising a second stage responsive to said first receiver signal for producing said output signal, said second stage being a duplicate of said second subpart.

* * * * *